(12) United States Patent
Morita

(10) Patent No.: US 6,503,360 B2
(45) Date of Patent: Jan. 7, 2003

(54) ETCHING METHOD AND APPARATUS

(75) Inventor: Kiyoyuki Morita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/905,894

(22) Filed: Jul. 17, 2001

(65) Prior Publication Data

US 2001/0037860 A1 Nov. 8, 2001

Related U.S. Application Data

(62) Division of application No. 09/771,549, filed on Jan. 30, 2001.

(30) Foreign Application Priority Data

Jan. 31, 2000 (JP) ........................................ 2000-022328

(51) Int. Cl.[7] .............................................. B05D 5/00
(52) U.S. Cl. ..................................................... 156/345
(58) Field of Search ............................ 156/345; 451/93, 451/282, 283, 284, 285, 286, 287, 288, 289; 216/88, 89, 90

(56) References Cited

U.S. PATENT DOCUMENTS

| 3,775,202 A | * 11/1973 | Meek et al. ................... 216/86 |
| 3,999,564 A | * 12/1976 | Pesek ........................ 134/57 R |
| 4,372,805 A | * 2/1983 | Takahashi et al. ............. 216/93 |
| 5,328,670 A | * 7/1994 | Hirabayashi et al. ........ 423/140 |
| 5,980,771 A | * 11/1999 | Cowan ......................... 216/93 |
| 5,985,165 A | * 11/1999 | Fukuta et al. .................. 216/93 |
| 6,200,414 B1 | * 3/2001 | Hwang et al. ............... 156/345 |

OTHER PUBLICATIONS

H. F. Gray et al., "A Vacuum Field Effect Transistor Using Silicon Field Emitter Arrays", IEDM 86, pp. 776–779.

G. L. Bakker et al., "Removal of Thermally Grown Silicon Dioxide Films Using Water at Elevated Temperature and Pressure", J. Electrochem. Soc., vol. 142, vol. 142, No. 11, pp. 3940–3944, Nov. 1995.

* cited by examiner

Primary Examiner—Thi Dang
(74) Attorney, Agent, or Firm—Nixon Peabody LLP; Donald R. Studebaker

(57) ABSTRACT

A subcritical or supercritical water is used to selectively etch a silicon nitride film against a silicon dioxide film or to selectively etch a silicon dioxide film against a crystalline silicon region. This method is applicable to a process of forming a MISFET or a charge emitting device.

3 Claims, 17 Drawing Sheets

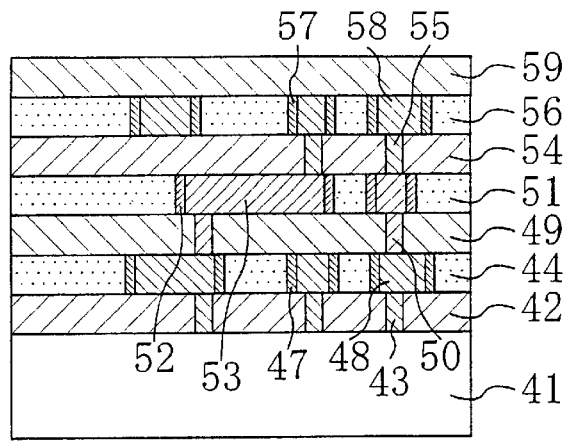
FIG. 10E
FIG. 10F
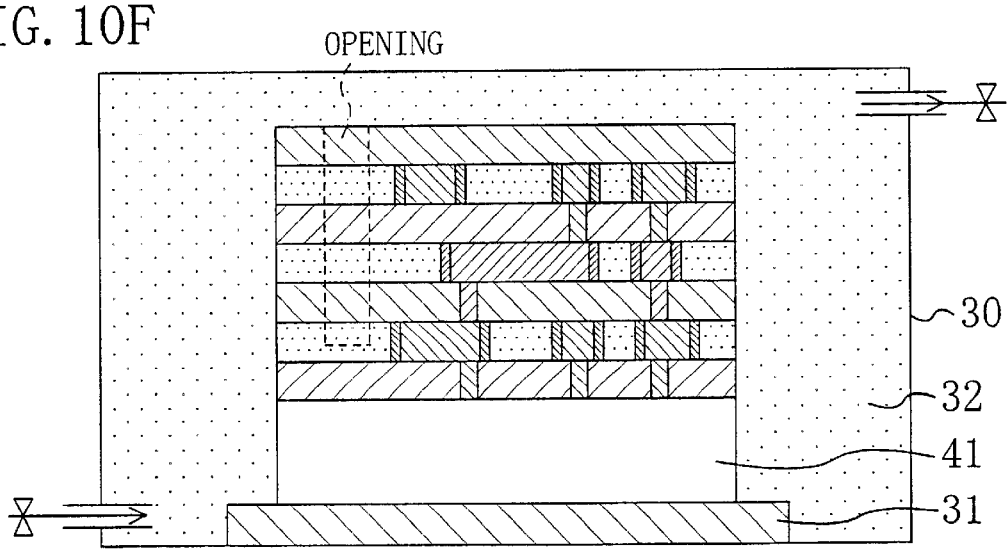
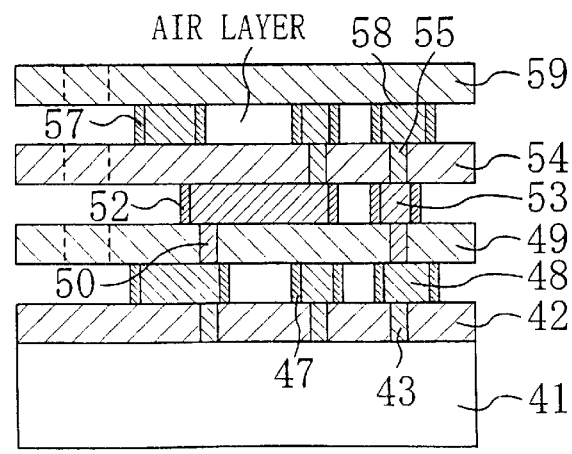
FIG. 10G

POROUS FILM

ETCHING METHOD AND APPARATUS

This application is a divisional of prior application Ser. No. 09/771,549 filed Jan. 30, 2001.

BACKGROUND OF THE INVENTION

The present invention relates to a method for selectively etching an intended part of an object being processed with a fluid, which is kept in liquid phase by heating and pressuring the fluid, and also relates to an etching apparatus.

A process of etching a silicon nitride film using hot phosphoric acid, for example, is one of known methods for selectively etching just one of multiple layers stacked over a substrate (W. van Gelder and V. E. Hauser, J. Electrochem. Soc., 144, 869 (1967)). This etching method utilizes hot phosphoric acid because the acid etches a silicon nitride film at a rate much higher than a silicon dioxide film. Therefore, according to this etching method, only the silicon nitride film can be selectively etched away with the silicon dioxide film left. In this case, a selectivity obtained by the etching process using hot phosphoric acid is as high as 30 to 50, whereas a selectivity obtained by a dry etching process is only about 15. Accordingly, this type of etching process has been used widely in the fabrication process of semiconductor devices.

However, if this known selective etching process using hot phosphoric acid, for instance, is performed, the following problems arise.

Firstly, hot phosphoric acid results in a low etch rate. If a silicon nitride film is etched using hot phosphoric acid heated up to about 150° C., for example, an etch rate of just about 4 nm/min is attainable. In this case, a silicon dioxide film can be etched with the hot phosphoric acid at a rate of about 0.13 nm/min and the etch selectivity of silicon nitride to silicon dioxide is about 31. That is to say, the etch selectivity is high to a certain extent but the etch rate is low. To the contrary, if the etching process is performed using hot phosphoric acid heated up to about 180° C., the etch rate of the silicon nitride film can be increased up to about 10 nm/min but the etch selectivity decreases to about 10. That is to say, it is hard to attain both a high etch rate and a high etch selectivity.

Secondly, if an acid such as phosphoric acid is disposed of as it is, the environment might be polluted in various ways. For example, disposal of phosphoric acid causes eutrophication of rivers or seawater. Therefore, phosphoric acid should be treated before it is disposed of, but a complete treatment rises the treatment cost. It is also known that if a silicon dioxide film is selectively etched using hydrofluoric acid, for example, a serious problem might arise. For example, disposal of the hydrofluoric acid withers plants. Generally speaking, it is natural that substances such as acids and alkalis, exhibiting some etch capability, might damage the tissues of human bodies, animals, plants and so forth.

Further, when a dry etching process is performed, the resultant etch selectivity is not higher than 15 and the resultant etch rate is only about 10 nm/min. Also, in this dry etching process, even a semiconductor substrate, which is located under an object being processed and should not be etched, is damaged unintentionally due to exposure to plasma ions, thereby possibly causing defects such as dislocations.

SUMMARY OF THE INVENTION

Water, carbonic acid gas and so on are fluids exhibiting very low etch capability in a normal state but does not affect the environment so much. However, we found that even a fluid like this shows unique etch capability in a special state if the fluid is heated and pressured under some specific conditions. It is therefore an object of the present invention to provide etching method and apparatus for selectively and efficiently removing a target layer from an object being processed by utilizing this phenomenon.

An inventive etching method is a method for etching a target layer of an object being processed. The method includes the steps of: heating and pressuring a fluid under such conditions that the fluid is a liquid; and exposing the target layer to the fluid and allowing a substance in the fluid to react with the target layer, thereby etching away the target layer.

According to this method, only a target layer of an object being processed can be selectively etched away with a certain fluid at a high rate by heating and pressuring the fluid, even though the fluid does not exhibit that high etch rate at a normal temperature and at a normal pressure. For example, a fluid such as water or carbon dioxide hardly affects the environment at a normal temperature and at a normal pressure, and the treatment cost of the fluid used is very low. The etch capability of a fluid under some specific conditions is greatly different from that of the fluid in a normal state. Accordingly, by utilizing this phenomenon, the etching process can be performed efficiently as a whole.

When the etching process is performed using a water as the fluid, a target layer may be exposed to the water that is a roughly subcritical liquid.

Particularly where the target layer is a silicon nitride film or a crystalline silicon layer, the water is preferably heated to a temperature between 150° C. and 315° C. and preferably pressured to a vapor pressure or higher. The water is more preferably heated to a temperature between 150° C. and 250° C.

Also, where the target layer is a silicon nitride film or a crystalline silicon layer, at least a silicon dioxide film may be used as an etch stopper. In that case, a selective etching process can be performed because a water as a subcritical liquid can etch the silicon nitride film at a higher rate than the silicon dioxide film.

An inventive apparatus etches a target layer of an object being processed using a fluid. The apparatus includes: a vessel in which the object is loaded and subjected to an etching process; a fluid supplier for supplying the fluid into the vessel; means for separating the fluid, drained from the vessel, from a substance resulting from the etching process; a reservoir for storing the fluid that has been separated by the separating means; and means for circulating the fluid from the reservoir back to the fluid supplier.

This apparatus can recycle a fluid once used after the composition and purity of the fluid have been adjusted appropriately for an etching process. As a result, the cost and time for the etching process can be further reduced.

Where the fluid is a water, the separating means may vaporize the water to separate the water from the substance resulting from the etching process.

Also, the separating means may condense the substance resulting from the etching process to separate the substance from the fluid.

BRIEF DESCRIPTION OF THE DRAWINGS

FIGS. 10A through 10G are cross-sectional views illustrating respective process steps of fabricating a semiconductor device with a gas-dielectric interconnect structure according to a second embodiment of the present invention.

DESCRIPTION OF THE PREFERRED EMBODIMENTS

Hereinafter, embodiments of method and apparatus for depositing a thin film according to the present invention will be described with reference to the accompanying drawings.
Embodiment 1

FIGS. 1A through 1H are cross-sectional views illustrating respective process steps of fabricating a semiconductor device according to a first embodiment of the present invention.

Figure 1A:
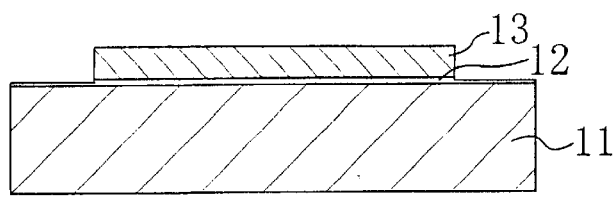
FIGS. 1A through 1H are cross-sectional views illustrating respective process steps for fabricating a semiconductor device according to a first embodiment of the present invention.

First, in the process step shown in FIG. 1A, a pad oxide film 12, which is a silicon dioxide film with a thickness of about 20 nm, and a silicon nitride film 13 with a thickness of about 160 nm are deposited in this order over a p-type Si substrate 11. Then, parts of the pad oxide film 12 and silicon nitride film 13, in which a field oxide film will be formed, are removed to form openings. It is noted that part of the pad oxide film 12 still exists in the openings.

Figure 1B:
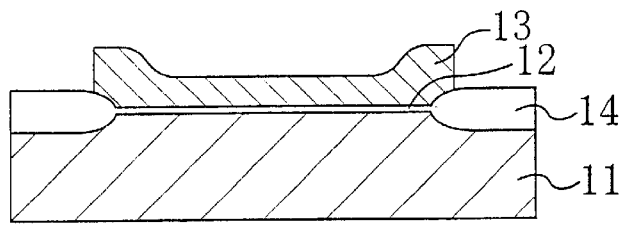

Next, in the process step shown in FIG. 1B, the remaining part of the pad oxide film 12 and the surface of the Si substrate 11 are thermally oxidized, thereby forming a field oxide film 14 with a thickness of about 400 nm. The field oxide film 14 may have a so-called LOCOS structure.

Figure 1C:
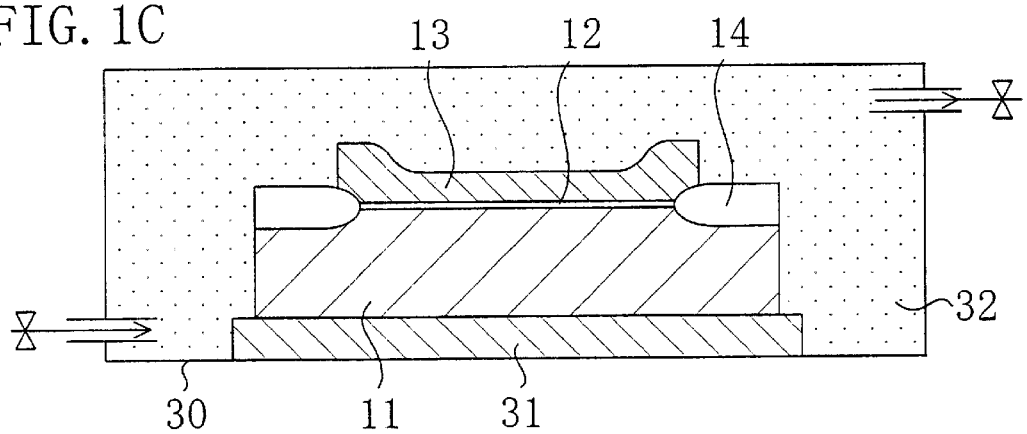

Subsequently, in the process step shown in FIG. 1C, the substrate is placed on a sample stage 31 with heater inside a vessel 30. In this embodiment, the vessel 30 is capable of withstanding not only a high pressure of 500 mb (=about 50.65 MPa) but also an elevated temperature of about 700° C.

Figure 3:
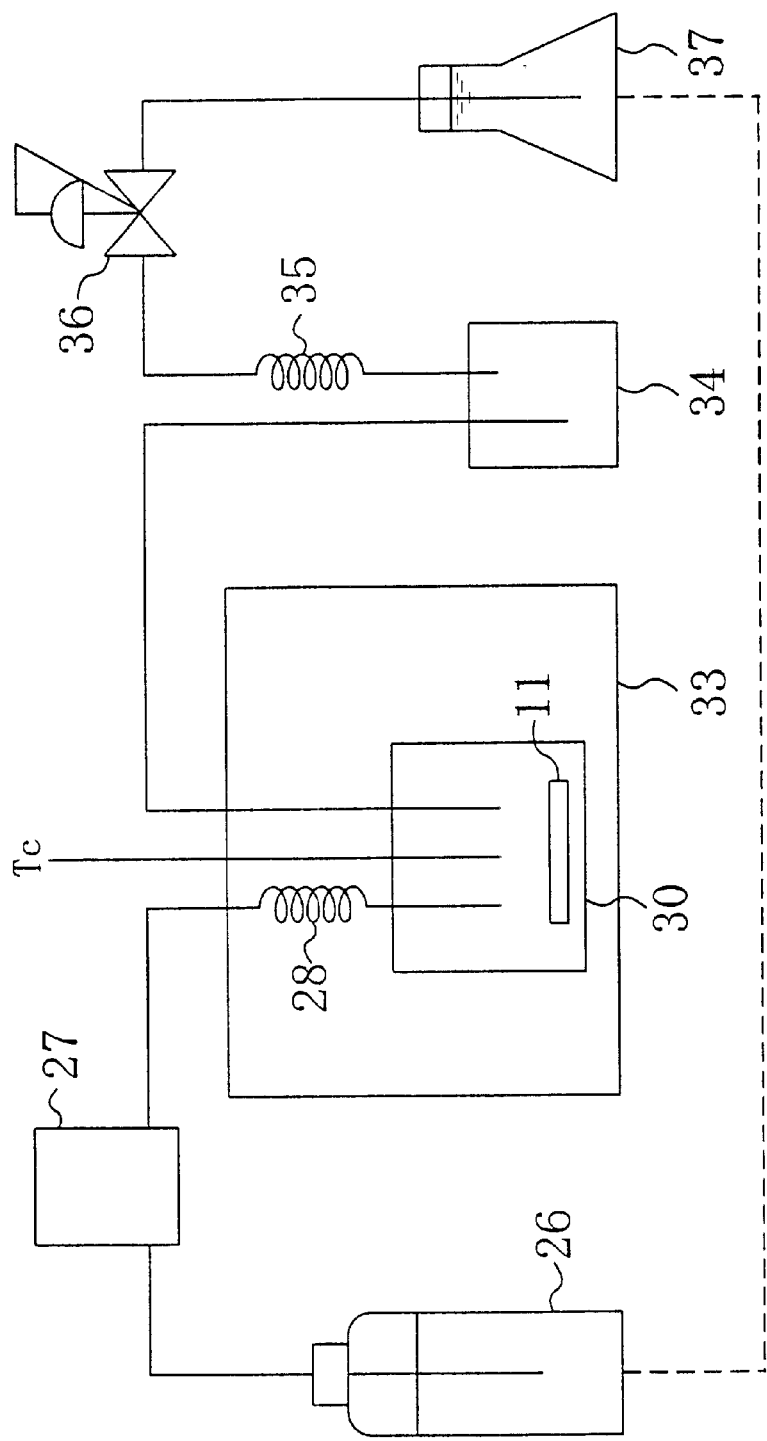
FIG. 3 is a partial cross-sectional view schematically illustrating an arrangement for an etching apparatus for use in the first and second embodiments.

FIG. 3 schematically illustrates an arrangement for an etching apparatus for use in the etching process of this embodiment. In the illustrated embodiment, the vessel 30, withstanding the high pressure, is placed within an oven 33. The etching apparatus is so configured as to heat either the entire vessel 30 or the substrate alone using the sample stage 31 shown in FIG. 1C.

The apparatus can also measure the temperature inside the vessel 30 using a temperature sensor TC. Further, tank 26 for supplying water (ultrapure water) kept at a high temperature, liquid pump 27 for pumping out the water into the vessel 30 and cooler 28 for cooling down the water are provided, thus making up a supply system for supplying subcritical or supercritical fluid to the vessel 30. In this case, the subcritical fluid includes both strictly and roughly subcritical fluids alike.

Furthermore, separator 34 for separating an etch reactant from the fluid drained from the vessel 30, cooler 35 provided on the exhaust pipe extending from the separator 34, back pressure control valve 36 for controlling the entire space around the vessel 30 at a predetermined high pressure and reservoir 37 for storing the drained water are provided, thus making up an exhaust system. The etching process is performed using this apparatus with the vessel 30 filled with water 32 as a roughly subcritical liquid as shown in FIG. 1C.

Hereinafter, it will be described with reference to FIG. 2 exactly what the subcritical and supercritical states mean.

Figure 2:
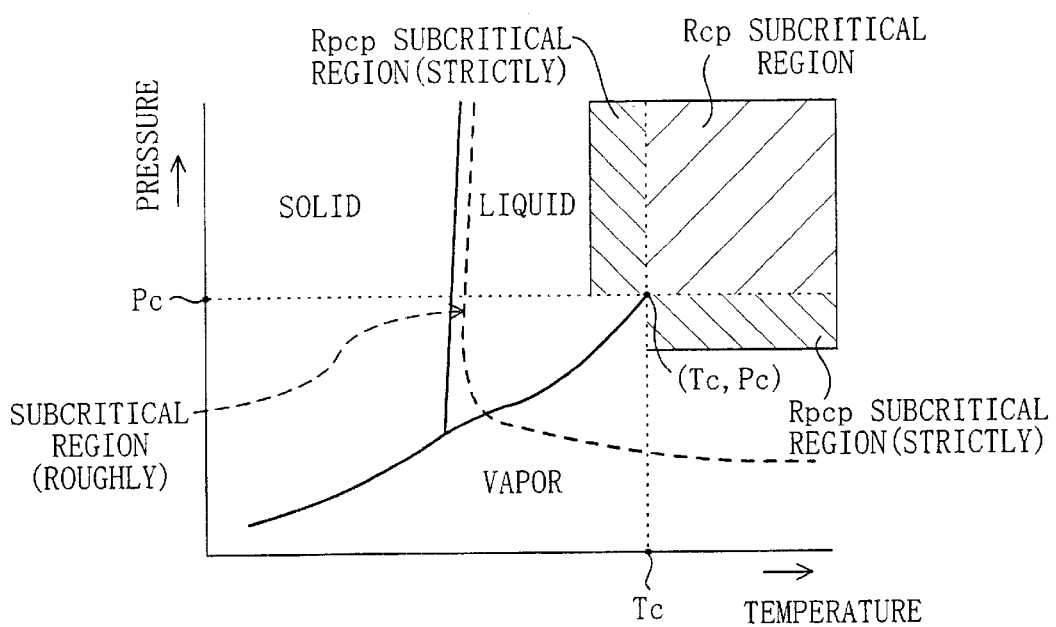
FIG. 2 illustrates the state transition of a fluid such as carbon dioxide or water.

FIG. 2 illustrates the state transition of a fluid such as carbon dioxide or water. In FIG. 2, the abscissa represents the temperature, while the ordinate represents the pressure. The coordinates (Tc, Pc) define a critical point where the temperature and pressure are equal to the critical temperature Tc and critical pressure Pc, respectively. A region where the temperature and pressure are equal to or higher than the critical temperature Tc and critical pressure Pc, respectively, is defined as a supercritical region Rcp. A region where the temperature is equal to or higher than the critical temperature Tc but the pressure is slightly lower than the critical pressure Pc and a region where the pressure is equal to or higher than the critical pressure Pc but the temperature is slightly lower than the critical temperature Tc are defined as "subcritical regions Rpcp" in the narrow sense. The subcritical regions Rpcp will be herein called "strictly subcritical regions". It is known that in the supercritical region Rcp, carbon dioxide or water is a supercritical fluid exhibiting different phase and properties than those of gas, liquid or solid. Further, even a region not included in the strictly subcritical regions Rpcp may also be called a subcritical region if the temperature and pressure are relatively high in that region. Specifically, that region is located between the dotted line and the supercritical and subcritical regions Rcp and Rpcp as shown in FIG. 2. This intermediate region and the strictly subcritical regions will be herein called a "roughly subcritical region" collectively.

In this embodiment, the critical temperature Tc of the water as a typical fluid is about 374.3° C., for example, and its critical pressure Pc is about 22.1 MPa (≈about 217.6 atm). Alternatively, carbonic acid gas (carbon dioxide) may also be used in the same way as the water. In that case, the critical temperature Tc of carbon dioxide is about 31.2° C. and its critical pressure Pc is about 7.37 MPa (≈about 72.8 atm).

In this embodiment, the temperature and pressure inside the vessel 30 are held at about 200° C. and about 10 MPa, respectively. Thus, all of the water inside the vessel 30 is in liquid phase and in the roughly subcritical state. In other words, the pressure and temperature of the water are raised to such an extent that the water becomes a roughly subcritical liquid. Also, if only the substrate 11 needs to have its temperature raised, the temperature of the substrate 11 can be controlled using the sample stage 31.

Thereafter, by exposing the substrate 11 to the water 32 as the roughly subcritical liquid, for about 22 minutes, the silicon nitride film 13 on the substrate 11 can be etched away selectively. In this case, the silicon nitride film 13 is etched at a rate of about 7.5 nm/min with the water prepared by the method of this embodiment under some specific conditions and the silicon dioxide film is etched at a rate of about 0.11 nm with the water as will be detailed later. The specific conditions include a pressure of about 10 MPa and a temperature of about 200° C. And the etch selectivity of the silicon nitride to the silicon dioxide is about 70. Accordingly, the silicon nitride film 13 can be removed by performing this etching process, including an over etching process, while almost no part of the exposed field oxide film 14 is removed. As a result, it is possible to suppress the degradation in isolation function of the field oxide film 14 because the thickness of the field oxide film 14 does not decrease.

Figure 1D:
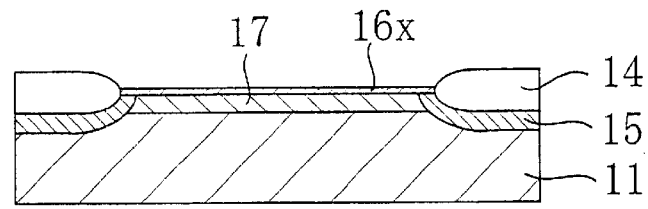

Next, in the process step shown in FIG. 1D, by unloading the substrate from the vessel 30 and then by performing an etching process using hydrofluoric acid, the pad oxide film 12 is removed. In this case, the field oxide film 14 is also etched and its thickness decreases. However, the removed part of the field oxide film 14 is just slightly greater in thickness than that of the pad oxide film 12. Therefore the field oxide film 14 with a thickness of about 400 nm is hardly affected by this etching process. It is noted that the process of removing the pad oxide film 12 may be performed in the vessel 30 for about 20 minutes using a water with a pressure of about 10 MPa and a temperature of about 200° C. Also, the silicon dioxide film may be removed with water so that the silicon dioxide is etched away at a higher rate. In those cases, hydrofluoric acid is unnecessary.

Subsequently, a surface region of the substrate 11 is thermally oxidized, thereby forming a silicon dioxide film 16x, which will be a gate insulating film, to a thickness of about 10 nm on the active region surrounded by the field oxide film 14. Thereafter, to control the threshold voltage of the resultant transistor, ions of a p-type dopant, e.g., boron, are implanted into the substrate 11. In this manner, a threshold-controlling doped layer 17 is formed around the surface of the active region of the substrate 11. Further, channel stop regions 15 are formed in parts of the substrate 11 under the field oxide film 14. The channel stop regions 15 are also formed by the p-type dopant (e.g., boron) introduced. It should be noted that a p-well may be formed if necessary.

Also, in this embodiment, it is described how to form an n-channel MOS transistor. However, in a CMOS device, a p-channel MOS transistor is also formed. In that case, n-type dopant ions are implanted into the p-type substrate 11 to control the threshold voltage and to form the channel stopper and n-type well. As the n-type dopant ions, phosphorus, arsenic or boron ions may be selected depending on the type of the gate electrode material.

Figure 1E:
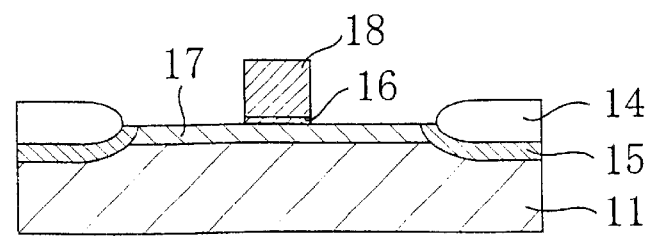

Next, in the process step shown in FIG. 1E, a polysilicon film is deposited to a thickness of about 330 nm over the substrate 11 by a low-pressure CVD process, for example. Then, phosphorus is diffused at a high concentration of about $10^{20}$ cm$^{-3}$ into the polysilicon film by a solid phase diffusion process using $POCl_3$, for instance. In this manner, the polysilicon film is changed into an n-type heavily doped and degenerated polysilicon film. Further, a photoresist mask (not shown) is defined by photolithography, for example. Then, the n-type heavily doped polysilicon film is patterned by a dry etching process, e.g., RIE, using the photoresist mask, thereby forming a gate electrode 18. In this case, part of the silicon dioxide film 16x, which is not covered with the gate electrode 18, is removed under the etching conditions of this embodiment as shown in FIG. 1E. As a result, only the part of the silicon dioxide film 16x to be the gate insulating film 16 is left under the gate electrode 18. Alternatively, in the process step shown in FIG. 1E, the entire silicon dioxide film 16x may be left.

In this manner, where multiple layers (e.g., the silicon nitride and silicon dioxide films 13 and 14) are exposed over the substrate 11 as in this embodiment, an intended part (e.g., the silicon nitride film 13) can be etched away at a high etch selectivity and a high etch rate with a fluid such as the supercritical or roughly subcritical water. In addition, it is also possible to avoid the environmental pollution caused by the disposal of phosphoric acid or the like that has been used widely.

Figure 1F:
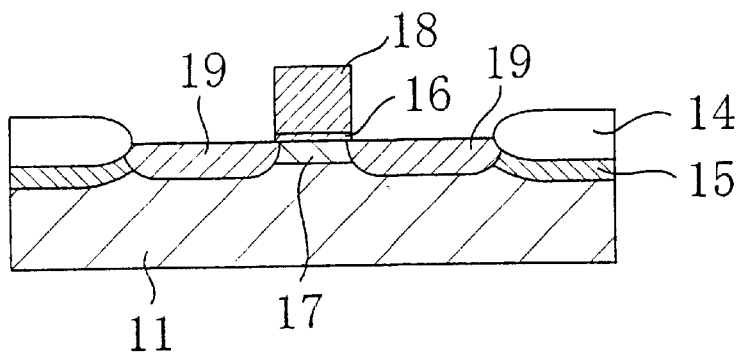

Next, in the process step shown in FIG. 1F, arsenic or phosphorus ions are implanted using the gate electrode 18 and field oxide film 14 as a mask. Subsequently, the dopant introduced is activated by an RTA (rapid thermal anneal) process, for example, thereby forming an n-type doped layer 19 to be source and drain regions.

Figure 1G:
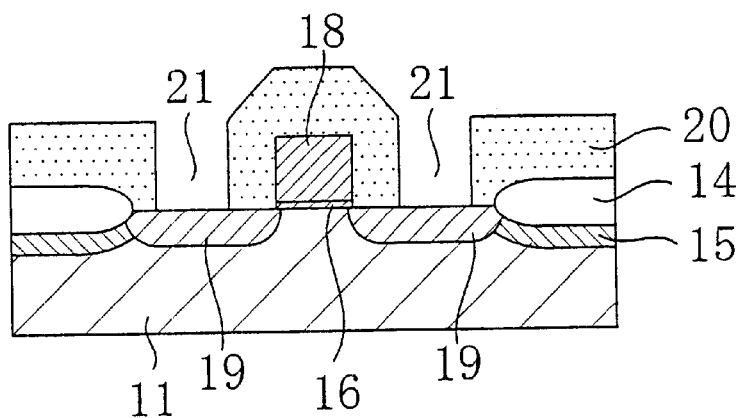

Next, in the process step shown in FIG. 1G, an interlevel dielectric film 20 is formed out of a silicon dioxide film with a thickness of about 800 nm over the substrate 11. Then, contact holes 21, passing through the interlevel dielectric film 20 to reach the n-type doped layer 19, are formed by ordinary photolithography and dry etching processes. Although only the contact holes 21 reaching the n-type doped layer 19 to be the source and drain regions are shown in FIG. 1G, another contact hole, passing through the interlevel dielectric film 20 to reach the gate electrode 18, is also formed in a cross section other than that shown in FIG. 1G.

Figure 1H:
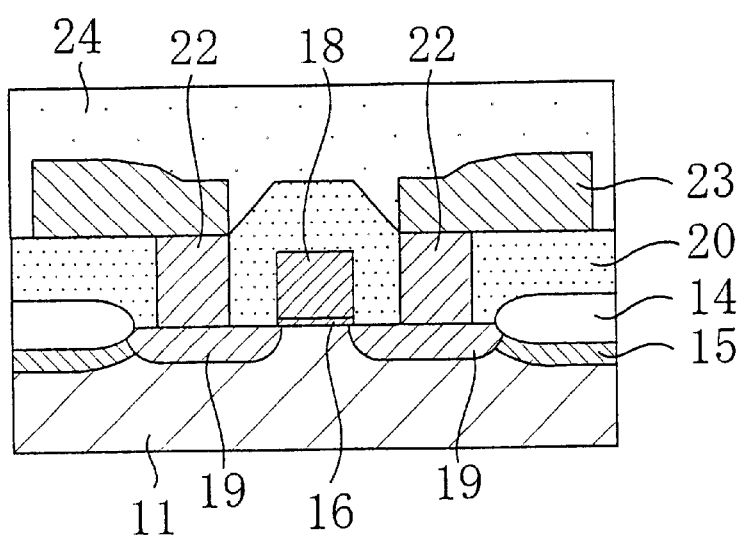

Thereafter, in the process step shown in FIG. 1H, tungsten is inlaid into the contact holes 21 by a CVD process, for example, to form tungsten plugs 22. Further, an aluminum alloy film with a thickness of about 800 nm is deposited over the tungsten plugs 22 and interlevel dielectric film 20. The aluminum alloy film often contains Cu or Si. Then, the aluminum alloy film is patterned by ordinary photolithography and dry etching processes, thereby forming aluminum lines 23. Furthermore, a passivation film 24 is deposited and then bonding pads (not shown) are formed. The passivation film 24 consists of a plasma oxide film with a thickness of about 200 nm and a plasma nitride film with a thickness of about 600 nm.

In the method for depositing an oxide film using the supercritical water according to this embodiment, the silicon nitride film can be selectively etched away at a high etch rate and a high etch selectivity without using any chemical such as hot phosphoric acid unlike the known process. Accordingly, it is possible to increase the throughput and to prevent the environmental pollution.

It should be noted that if an appropriate amount of entrainer (extractant) is added to the supercritical or roughly subcritical fluid, the resultant etch rate and etch selectivity could be further raised.

In the foregoing embodiment, an exemplary application of the inventive etching method to the process of forming a field oxide film with a LOCOS structure has been described. Alternatively, the inventive etching method may also be applied to a trench isolation (e.g., a shallow trench isolation (STI)) structure that has been used often in recent years.

FIGS. 14A through 14G are cross-sectional views illustrating respective process steps for fabricating a semiconductor device according to a modified example of this embodiment, i.e., an exemplary application of the inventive etching method to the process of forming a field oxide film with an STI structure.

Figure 14A:
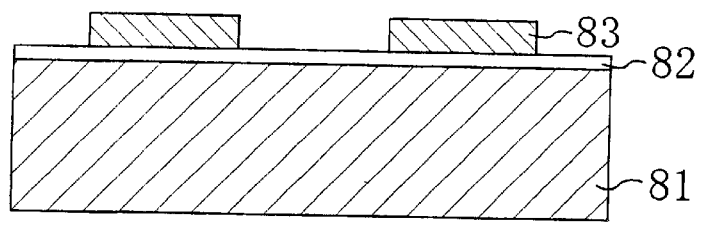
FIGS. 14A through 14G are cross-sectional views illustrating respective process steps for fabricating a semiconductor device according to a modified example of the first embodiment.

In the process step shown in FIG. 14A, a pad oxide film 82, which is a silicon dioxide film with a thickness of about 15 nm, and a silicon nitride film 83 with a thickness of about 200 nm are deposited in this order over a p-type Si substrate 81. Then, parts of the silicon nitride film 83, in which a field oxide film will be formed, are removed by ordinary photolithography and etching processes, thereby forming openings.

Figure 14B:
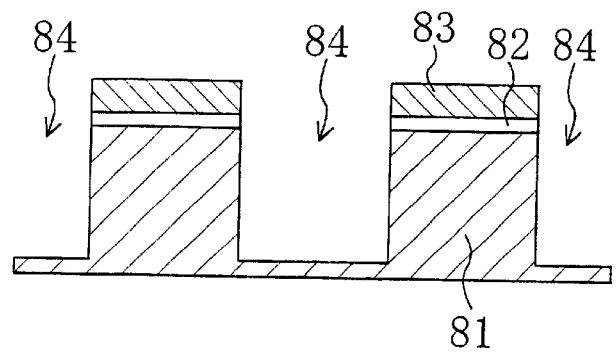

Next, in the process step shown in FIG. 14B, exposed parts of the pad oxide film 82 are removed by a dry etching process using the silicon nitride film 83 as a mask. Then, exposed parts of the substrate 81 are etched to a depth of about 400 nm, thereby forming trench openings 84.

Figure 14C:
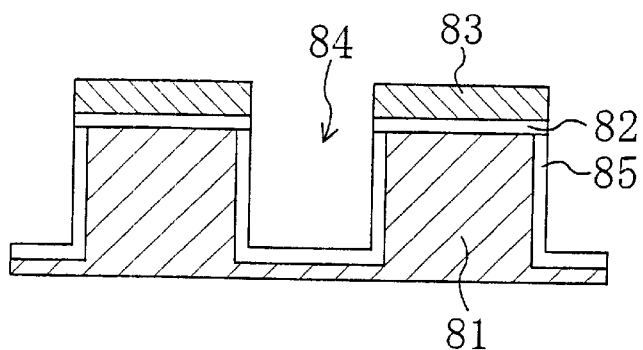

Subsequently, in the process step shown in FIG. 14C, parts of the substrate 81, which are exposed inside the trench openings 84, are oxidized, thereby forming an undercoat oxide film 85 at the bottom and side faces of each trench opening 84. In this case, parts of the substrate 81, which are not covered with the silicon nitride film 83, are not oxidized.

Figure 14D:
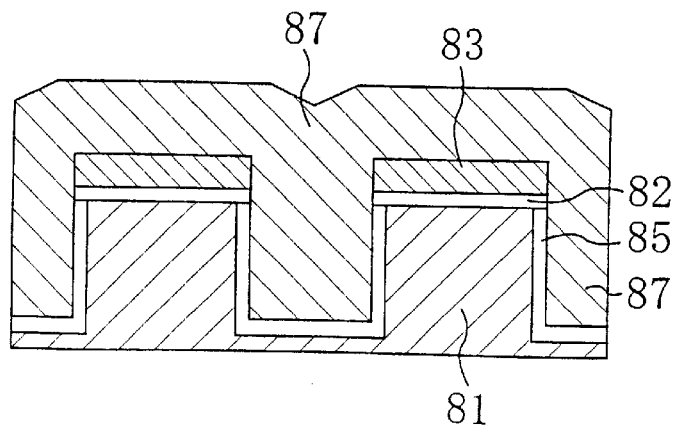

Thereafter, in the process step shown in FIG. 14D, an oxide film 87 to be buried is deposited to a thickness of 600 nm or more over the substrate by an LP-CVD process. In this case, the trench openings 84 are filled with the oxide film 87.

Figure 14E:
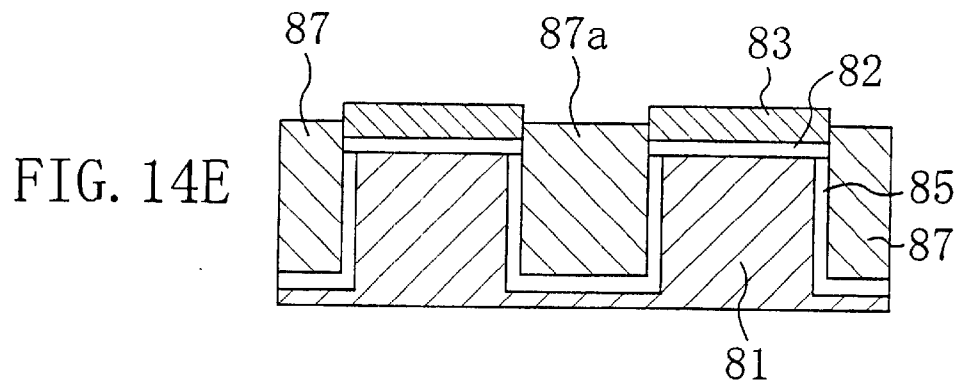

Subsequently, in the process step shown in FIG. 14E, parts of the oxide film 87 over the substrate 81 are removed by a CMP (chemical/mechanical polishing) process. In this case, the polishing process is finished when the silicon nitride film 83 is exposed on the surface of the substrate. In this manner, a field oxide film 87a, filling the trench openings 84, is formed as STIs.

Figure 14F:
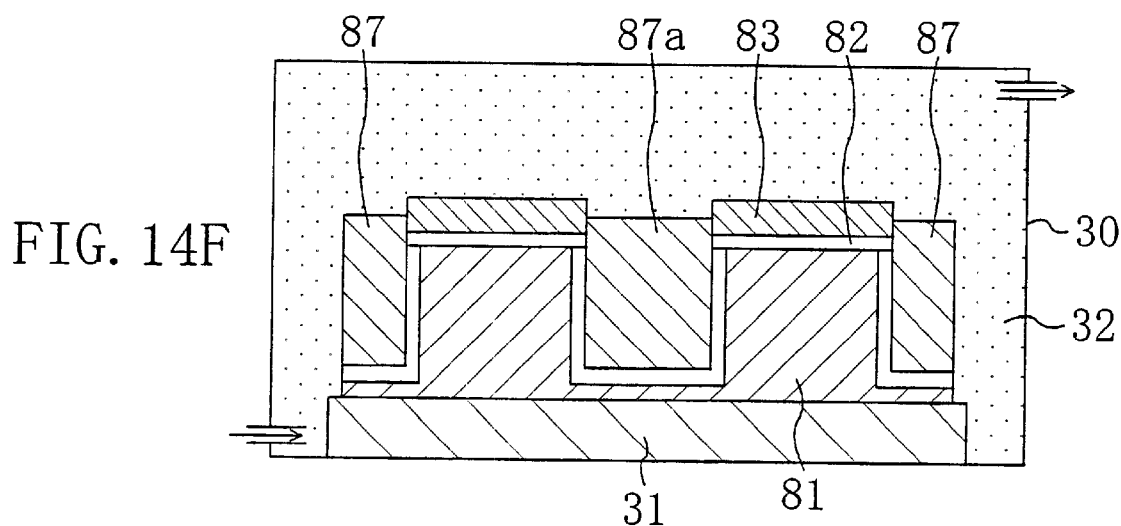

Next, in the process step shown in FIG. 14F, the substrate is placed on the sample stage 31 with heater inside a vessel 30. In this embodiment, the vessel 30 is capable of withstanding not only a high pressure of 500 mb (=about 50.65 MPa) but also an elevated temperature of about 700° C. The arrangement of the etching apparatus with the vessel 30 is as illustrated in FIG. 3.

By using this etching apparatus, the temperature and pressure inside the vessel 30 are kept at about 200° C. and about 10 MPa, respectively. And by exposing the substrate to the water 32 as a roughly subcritical liquid for about 27 minutes, the silicon nitride film 83 over the substrate 81 can be etched away selectively. In this case, the silicon nitride film 83 is etched at a rate of about 7.5 nm/min with the water prepared by the method of this embodiment under some specific conditions and the silicon dioxide film is etched at a rate of about 0.11 nm with the water as described above. The specific conditions include a pressure of about 10 MPa and a temperature of about 200° C. And the etch selectivity of the silicon nitride to the silicon dioxide is about 70. Accordingly, the silicon nitride film 83 can be removed by performing this etching process, including an over etching process, while the exposed parts of the field oxide film 87a are hardly removed. As a result, it is possible to suppress the degradation in isolation function of the field oxide film 87a because the thickness of the field oxide film 87a does not decrease.

Figure 14G:
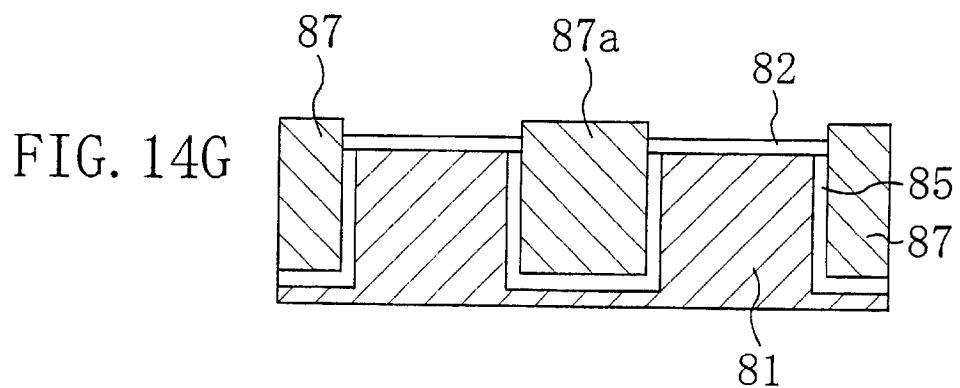

Next, in the process step shown in FIG. 14G, by unloading the substrate from the vessel 30, a structure, in which the silicon nitride film 83 used as an etching mask has been removed, is obtained.

Thereafter, the pad oxide film 82 is removed and then the same process steps as those shown in FIGS. 1A through 1H are performed, thereby forming an MOS transistor.

Experiments on Selective Etching

We carried out various experiments on selective etching. Hereinafter, the results will be described in detail.

Figure 4:
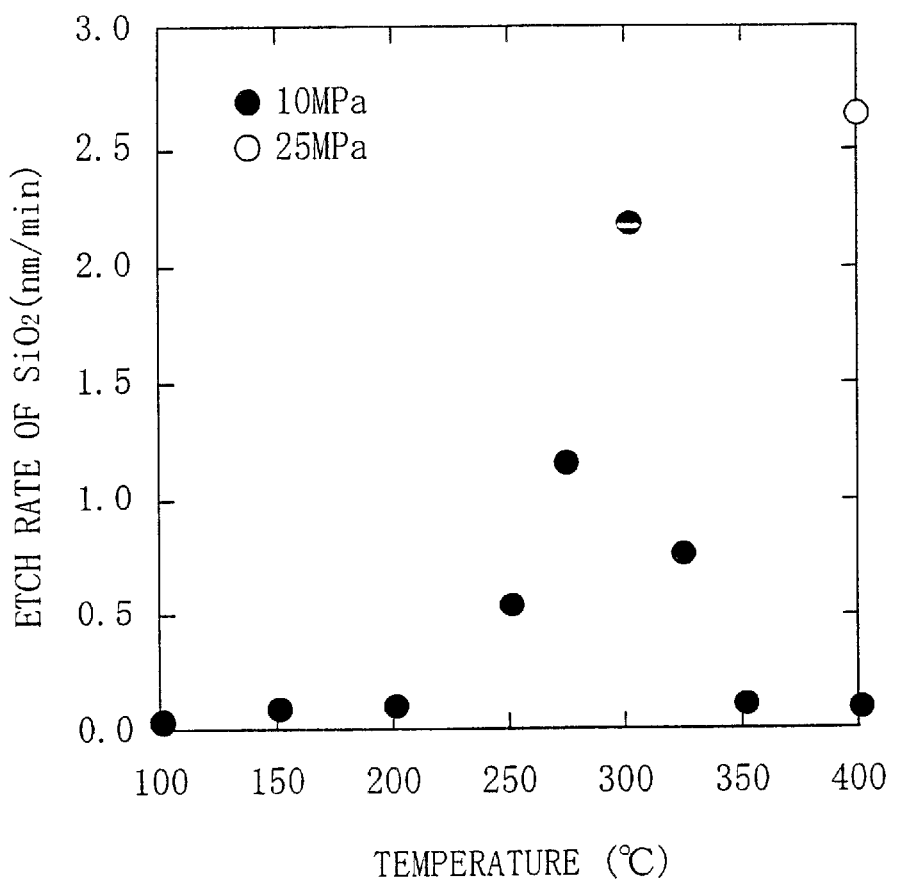
FIG. 4 is a graph showing basic experimental data for the inventive etching method and illustrating how the etch rate of a silicon dioxide film changes with the temperature of water at a constant pressure.

FIG. 4 is a graph illustrating how the etch rate of a silicon dioxide film changes with the temperature of water at a constant pressure. In FIG. 4, the abscissa represents the temperature (° C.) while the ordinate represents the etch rate (nm/min). The experiments were carried out on a silicon dioxide film formed by thermal oxidation at a pressure of 10 MPa and at various temperatures of 100° C., 150° C., 200° C., 250° C., 275° C., 300° C., 325° C., 350° C. and 400° C. As shown in FIG. 4, the higher the temperature, the higher the etch rate of the silicon dioxide. And when the temperature is at about 300° C., the etch rate reaches an outstanding peak of about 2.2 nm/min. But the etch rate is relatively low at the other temperatures. The reason why the etch rate decreases at 350° C. and 400° C. will be described later.

Figure 5:
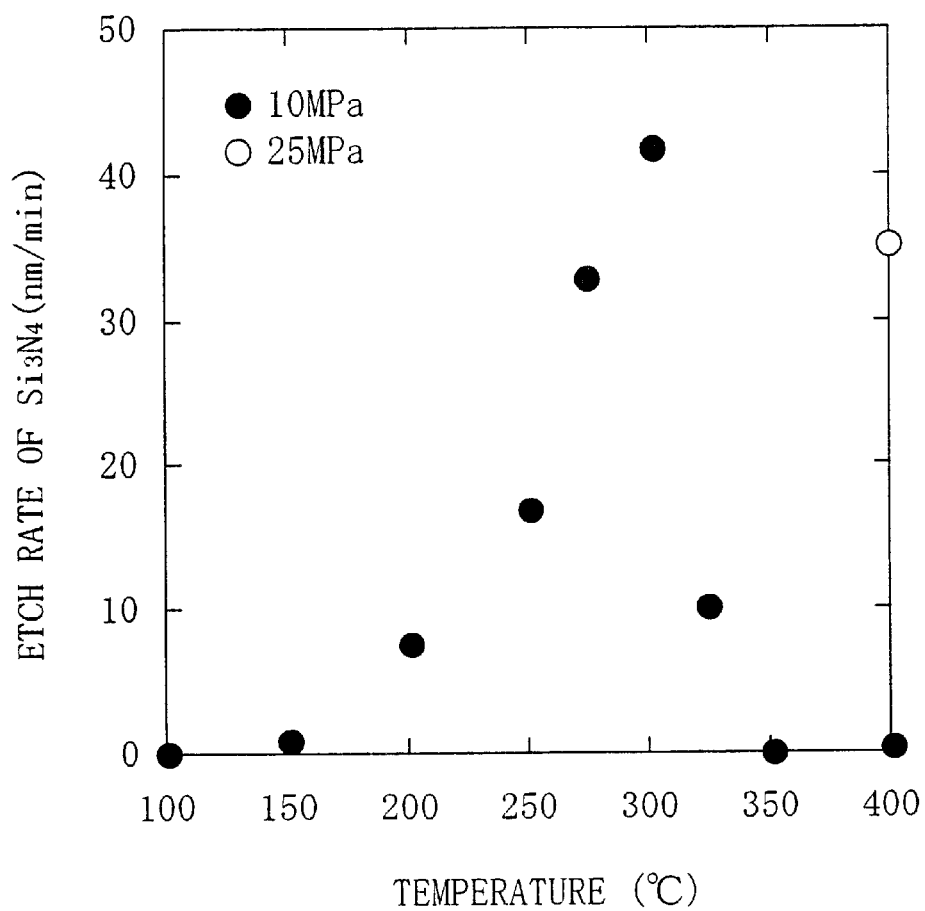
FIG. 5 is a graph showing basic experimental data for the inventive etching method and illustrating how the etch rate of a silicon nitride film changes with the temperature of water at a constant pressure.

FIG. 5 is a graph illustrating how the etch rate of a silicon nitride film changes with the temperature of water at a constant pressure. In FIG. 5, the abscissa represents the temperature (° C.) while the ordinate represents the etch rate (nm/min). The experiments were carried out on a silicon nitride film formed by an LP-CVD process at a pressure of 10 MPa and at various temperatures of 100° C., 150° C., 200° C., 250° C., 275° C., 300° C., 325° C., 350° C. and 400° C. As shown in FIG. 5, the etch rate of the silicon nitride is much higher than that of the silicon dioxide. The higher the temperature, the higher the etch rate of the silicon nitride. And when the temperature is at about 300° C., the etch rate also reaches an outstanding peak of about 42.0 nm/min as shown in FIG. 5.

Figure 6:
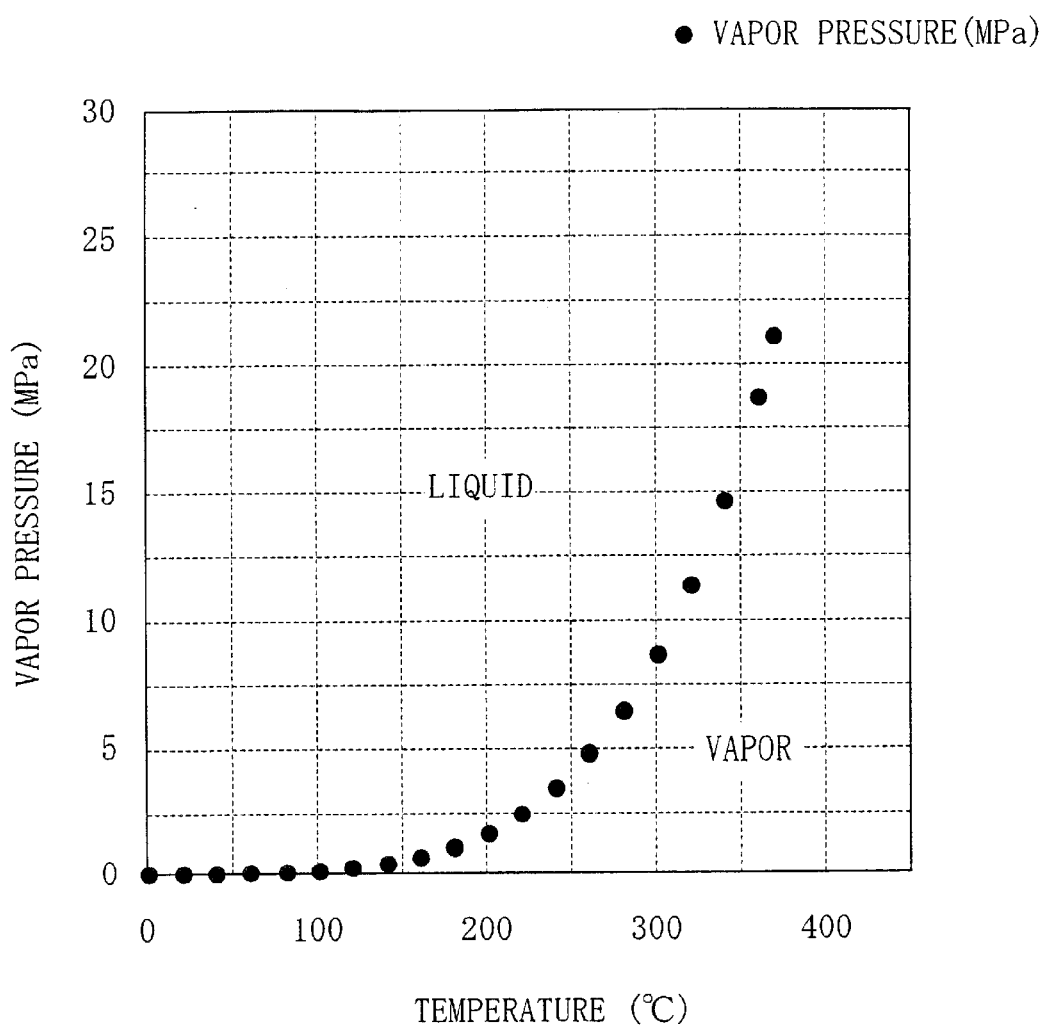
FIG. 6 is a graph illustrating temperature dependence of a vapor pressure.

FIG. 6 is a graph illustrating temperature dependence of a vapor pressure. In FIG. 6, the abscissa represents the temperature (° C.) while the ordinate represents the vapor pressure (MPa). And each of the dots (●) shown in FIG. 6 represents a vapor pressure associated with a particular temperature and corresponds to a vapor-liquid transition point. In other words, the water is liquid in the left-side region of FIG. 6 while the water is vapor in the right-side region of FIG. 6. When the pressure is 10 MPa, the vapor-liquid transition point is associated with 315° C. as shown in FIG. 6. That is to say, the water is vapor at temperatures equal to or higher than 315° C. Therefore, it is believed that the etch rates of the silicon dioxide and silicon nitride both decrease considerably at 350° C. and 400° C., respectively, as shown in FIGS. 4 and 5 because the water changes into vapor at these temperatures. Similarly, when the water is at 150° C., 200° C., 250° C. or 300° C., the vapor-liquid transition point is associated with 0.48 MPa, 1.55 MPa, 3.98 MPa or 8.59 MPa, respectively. Accordingly, at 150° C., 200° C., 250° C. or 300° C., an etching process can be performed effectively at a pressure equal to or higher than that associated with the vapor-liquid transition point, i.e., the vapor pressure.

Figure 7:
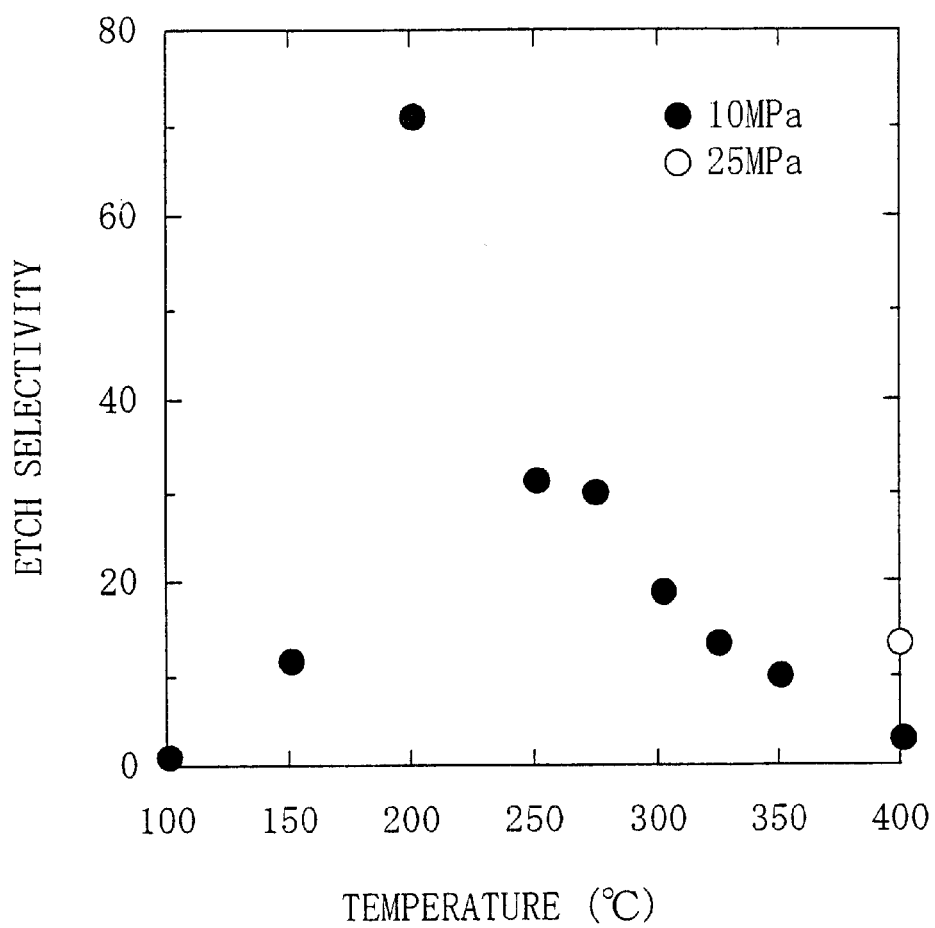
FIG. 7 is a graph illustrating temperature dependence of the etch selectivity of the silicon nitride film to the silicon dioxide film in accordance with the data shown in FIGS. 4 and 5.

FIG. 7 is a graph illustrating temperature dependence of the etch selectivity of the silicon nitride to the silicon dioxide film. This relationship is obtained from the data shown in FIGS. 4 and 5. In FIG. 7, the abscissa represents the temperature (° C.) while the ordinate represents the etch selectivity. As shown in FIG. 7, the etch selectivity reaches its maximum of about 75 at about 200° C. Generally speaking, even if the temperature varies, the etch selectivity between two materials does not change so much. However, if the heated and pressured water is used, the etch selectivity of the silicon nitride to the silicon dioxide film changes considerably as shown in FIG. 7. And this is a unique phenomenon. Hereinafter, our observations on that non-uniform temperature dependence of the etch selectivity will be described.

Figure 8:
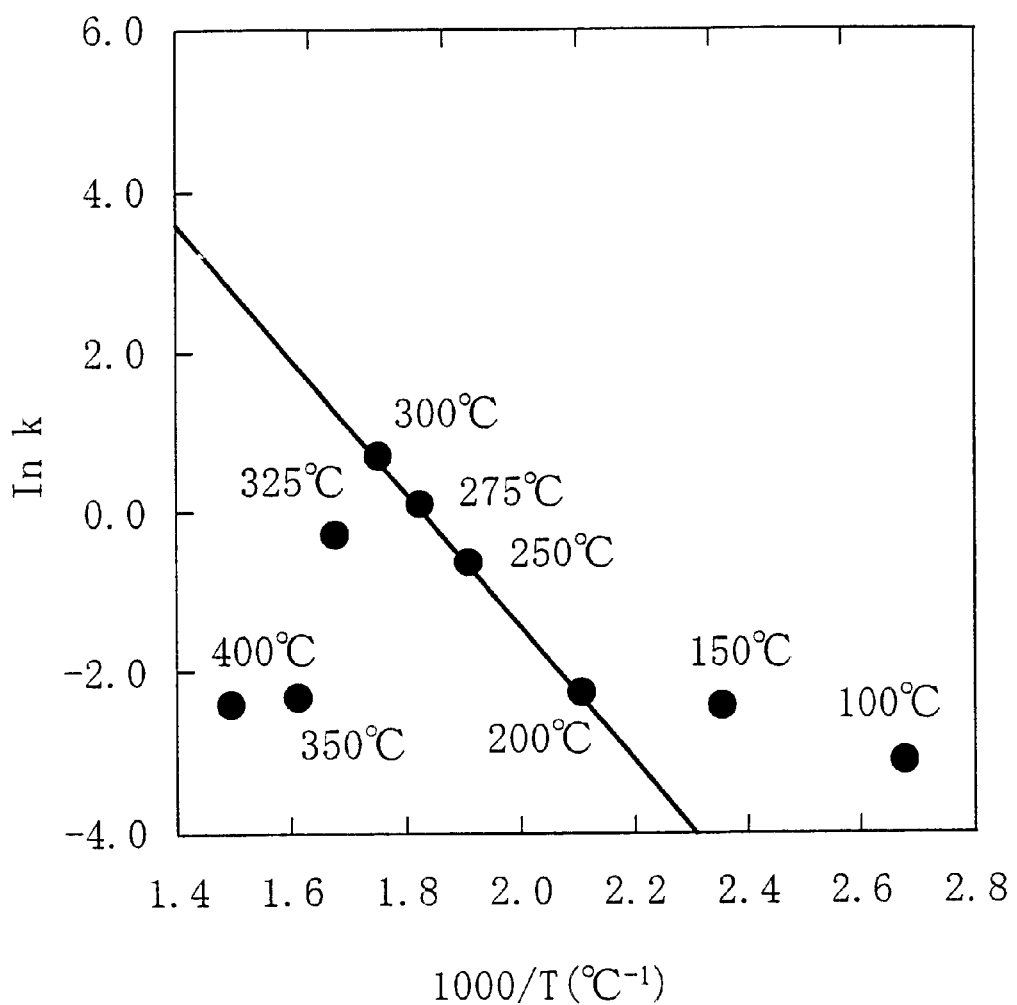
FIG. 8 is a graph illustrating the Arrhenius plot representing the etch rate of a silicon dioxide film in accordance with the data shown in FIG. 4.
Figure 9:
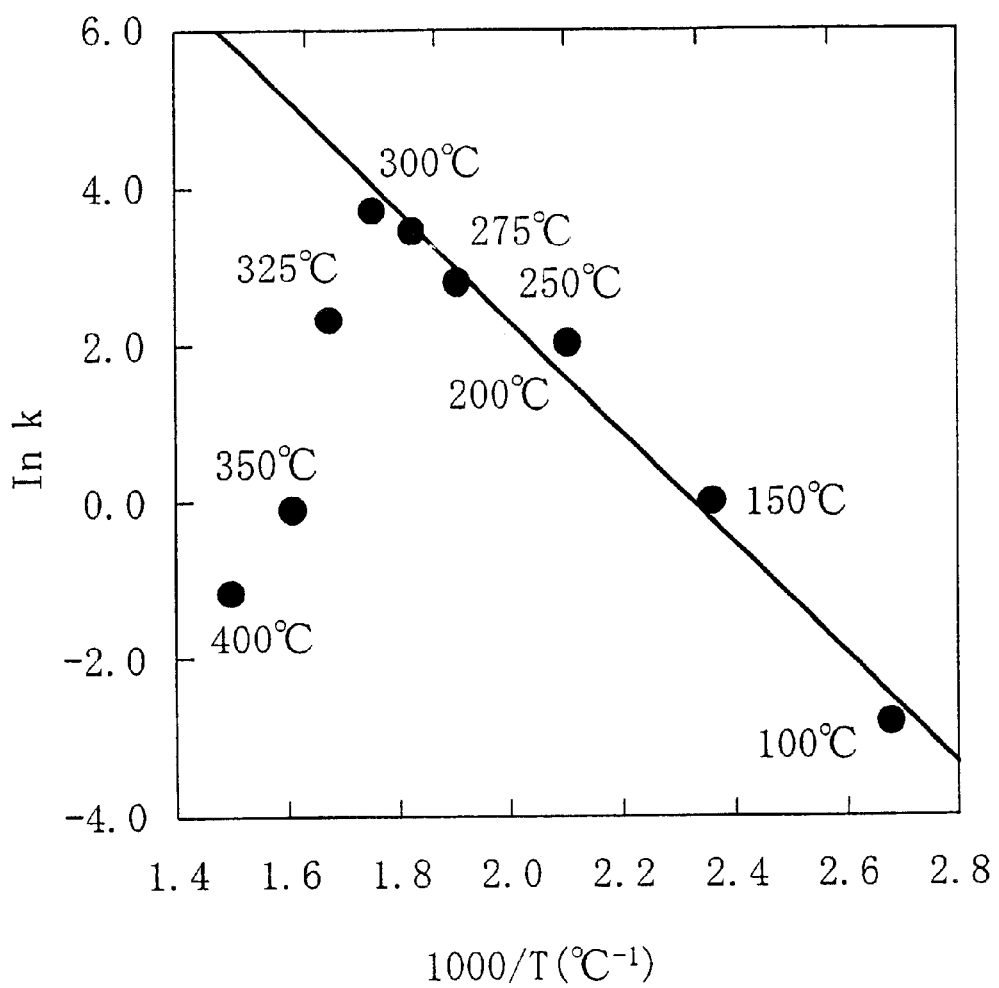
FIG. 9 is a graph illustrating the Arrhenius plot representing the etch rate of a silicon nitride film in accordance with the data shown in FIG. 5.

FIGS. 8 and 9 are graphs illustrating the Arrhenius plots representing the etch rates. These plots are obtained from the data shown in FIGS. 4 and 5, respectively. In FIGS. 4 and 5, the abscissa represents $1000/T$ ($K^{-1}$) (where T is the absolute temperature) while the ordinate represents the etch rate k(nm/min) in a logarithmic scale. The data (●) shown in FIGS. 8 and 9 respectively represents, from the left, the etch rates at 400° C., 350° C., 325° C., 300° C., 275° C., 250° C., 200° C., 150° C. and 100° C. In FIGS. 8 and 9, the water is vaporized at temperatures equal to or higher than 315° C. as described above. Accordingly, in the following description, the temperature is supposed to be equal to or lower than 300° C. where the water is liquid. As shown in FIG. 9, the Arrhenius plot representing the etch rate of the silicon nitride changes almost along a line and corresponds to the etching property of a normal etchant. However, as shown in FIG. 8, the Arrhenius plot representing the etch rate of the silicon dioxide does not change along a line but almost along two lines at temperatures equal to or lower than 300° C. In other words, this nonlinear rate change causes the non-uniform temperature dependence of the etch selectivity.

From the experimental results shown in FIGS. 4 through 9, the following conclusions are drawn.

Firstly, if the silicon nitride film of the object being processed, including the silicon nitride and silicon dioxide films, is selectively etched using the water with a pressure equal to or higher than the vapor pressure (=10 MPa in these experiments), a relatively high etch selectivity is attained at a temperature between 150° C. and 315° C. as shown in FIG. 7. Speaking more generally, a high etch selectivity is attainable while the water is a pressured liquid, i.e., what we call a roughly subcritical liquid.

However, when the water is at about 300° C., the etch rate of the silicon dioxide rises steeply as shown in FIG. 4. Therefore, in order to avoid this temperature range, the temperature of the water is preferably between 150° C. and 250° C.

Embodiment 2

Hereinafter, an embodiment of the inventive selective etching technique as a so-called "gas-dielectric interconnect structure" will be described. Specifically, the gas-dielectric interconnect structure is implemented by removing interlevel dielectric films from a multilevel interconnect structure and by filling dielectric layers between interconnects with the air.

FIGS. 10A through 10G are cross-sectional views illustrating respective process steps of fabricating a semiconductor device according to this embodiment.

Figure 10A:
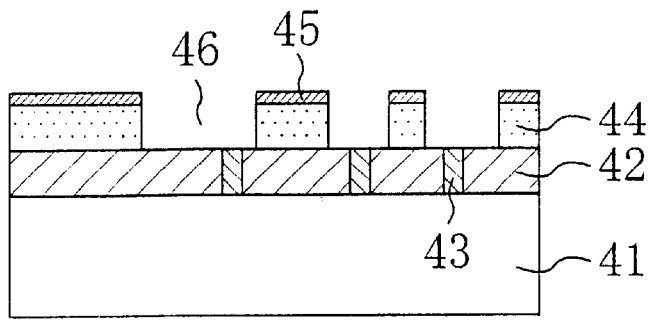

First, in the process step shown in FIG. 10A, a first interlevel dielectric film 42 of silicon dioxide and first-layer plugs 43 are formed on a substrate 41. Specifically, the first plugs 43 may be made of tungsten that has been inlaid into the contact holes formed in the first interlevel dielectric film 42. Active components such as MISFETs, bipolar transistors, memory cell transistors for flash memory and diodes, each including an electrode and a diffused layer, and passive components such as resistive, capacitive and impedance elements have been formed over the substrate 41. And the plugs 43 are connected to the electrodes and diffused layers of these components. Further, a first nitride film 44 of silicon nitride is deposited over the substrate. Then, a first-layer-interconnect etching mask 45 is defined on the first nitride film 44. The mask 45 is formed out of a fluorine-doped silicon dioxide film by removing its parts where interconnects will be formed. And the first nitride film 44 is patterned using the mask 45, thereby forming openings 46 for inlaid interconnects.

Figure 10B:
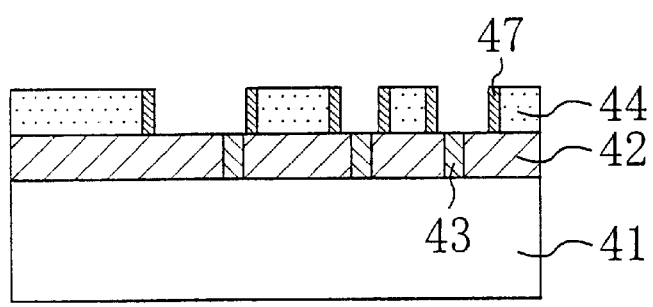

Next, in the process step shown in FIG. 10B, first-layer-interconnect sidewalls 47 of silicon dioxide are formed on the side faces of the openings 46. The sidewalls 47 may easily be formed by performing an anisotropic etching process using plasma after a silicon dioxide film has been deposited over the substrate.

Figure 10C:
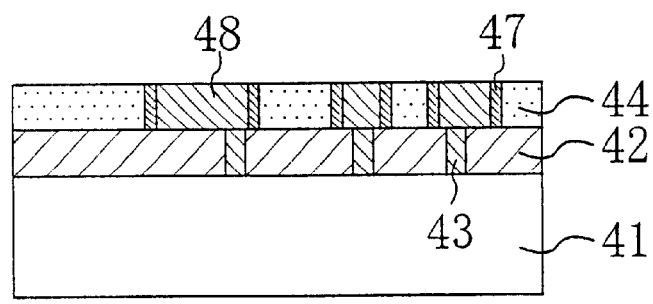

Subsequently, in the process step shown in FIG. 10C, a Cu alloy film, for example, is deposited over the substrate and then the upper surface of the substrate is planarized by a CMP process, thereby inlaying the Cu alloy film into the openings 46. In this manner, first-layer-interconnects 48, connected to the plugs 43, are formed.

Figure 10D:
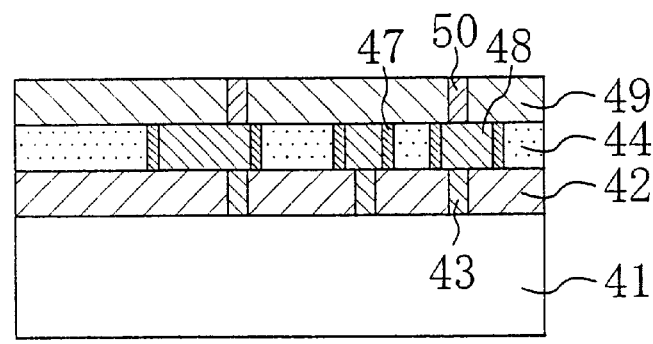

Thereafter, in the process step shown in FIG. 10D, a second interlevel dielectric film 49 of silicon dioxide is formed over the substrate. And via holes, passing through the second interlevel dielectric film 49 to reach the first-layer interconnect 48, are formed. Then, second-layer plugs 50 are formed by inlaying tungsten, for example, into these via holes.

Next, the foregoing process steps are repeatedly performed, thereby forming second and third nitride films 51 and 56, second- and third-layer-interconnect sidewalls 52 and 57, second- and third-layer interconnects 53 and 58, third interlevel dielectric film 54, third-layer plugs 55 and uppermost insulating film 59 over the second interlevel dielectric film 49 as shown in FIG. 10E. As a result, a basic framework for a multilevel interconnect structure is formed. Specifically, each of the second and third nitride films 51 and 56 is made of silicon nitride. Each of the second- and third-layer-interconnect sidewalls 52 and 57, third interlevel dielectric film 54 and uppermost insulating film 59 is made of silicon dioxide. Each of the second- and third-layer interconnects 53 and 58 is made of a Cu alloy. Each of the third-layer plugs 55 is made of tungsten, for example.

Subsequently, in the process step shown in FIG. 10F, the substrate is loaded into the vessel 30 of the etching apparatus shown in FIG. 3 and then the silicon nitride films are selectively etched away. In this case, the sides of the nitride films 44, 51 and 56 are exposed at the end of the substrate. If the end of the substrate is covered with a silicon dioxide film, the end of the substrate may be removed at least partially. Also, as indicated by the dotted line in FIG. 10F, at least one opening, reaching the first nitride film 44, may be formed.

Then, as in the first embodiment, the temperature and pressure inside the vessel 30 are kept at about 200° C. and about 10 MPa, respectively. In this manner, the nitride films 44, 51 and 56 are selectively etched away with the roughly subcritical liquid produced under these conditions.

Thereafter, in the process step shown in FIG. 10G, by unloading the substrate from the vessel 30, a semiconductor device with a so-called gas-dielectric interconnect structure is obtained. In this structure, the interconnects 48, 53 and 58 in each layer are surrounded by an air layer. And the interconnects 48, 53 and 58 are interconnected together through the plugs 50 and 55 and supported by the interlevel dielectric films 42, 49 and 54, respectively.

According to this embodiment, the silicon nitride films are selectively etched away against the silicon dioxide films and silicon substrate using a water at a high pressure, i.e., a roughly subcritical liquid with a high permeability. In this manner, a gas-dielectric interconnect structure can easily be formed so that only the silicon dioxide films (interlevel dielectric films) to be supporting films and interconnects are left with all the other part thereof removed. In other words, since the dielectric layers are air layers with a very low dielectric constant (=about 1), a parasitic capacitance between each pair of the interconnects is reduced. As a result, the semiconductor device can operate at high speeds.

It should be noted that, in the process steps shown in FIGS. 10A through 10G, a so-called single damascene process is performed. Alternatively, a dual damascene process may be performed. Specifically, the same material for interconnects and plugs may be inlaid into the insulating film at a time by the dual damascene process. Optionally, a well-known process of forming an interconnect structure may be performed to define a multilevel interconnect structure and then only the interlevel dielectric films of silicon nitride may be selectively etched away. In that case, a metal film, e.g., an aluminum alloy film, for forming interconnects is deposited over the entire surface of the substrate. And the metal film is patterned using a photoresist mask, thereby defining the interconnects. Then, the steps of alternately depositing a relatively thin silicon dioxide film as a supporting film and an interlevel dielectric film of silicon nitride are performed repeatedly, thereby defining the multilevel interconnect structure.

Also, the interconnect sidewalls are formed out of a silicon dioxide film on the side faces of the interconnects according to this embodiment, but may be omitted depending on the type of the metal material for the interconnects. For example, if the metal material, which will not be oxidized with the water as a roughly subcritical liquid, is used for the interconnects, the interconnect sidewalls are unnecessary. Moreover, even if exposed surface regions of the interconnects are oxidized, deeper parts of the interconnects will not be oxidized so long as a metal oxide film formed in the exposed surface regions is in a passive state. In that case, the interconnect sidewalls may be omitted. Also, if the deeper parts of the interconnects might be oxidized, the interconnect sidewalls are unnecessary so long as the interconnects are made of a metal that is etched at a rate much lower than a silicon nitride film.

In this embodiment, the gas-dielectric interconnect structure is implemented by removing the silicon nitride films and leaving the silicon dioxide films as supporting films for interconnects. Alternatively, the films to be removed and the films for supporting interconnects may be made of other materials. For example, a carbonic film (e.g., a carbon film) or an organic resin film (made of polyimide or photoresist material such as PMMA) may be used as the film to be removed. And a silicon dioxide or silicon nitride film may be used as the supporting film. In that case, by selectively etching away only the carbonic film or organic resin film with a roughly subcritical carbon dioxide inside the vessel, a gas-dielectric interconnect structure can be obtained as in this embodiment. Particularly when silicon dioxide films are used as the supporting films, the silicon nitride films can be sequentially etched away downward by permeating the carbon dioxide through the silicon dioxide films because the carbon dioxide has a low viscosity. When an organic resin film, for example, is used, the molecular weight of the organic resin should be reduced by exposing the resin to some type of radiation before the resin is removed with the carbon dioxide. In that case, the organic resin film can be etched away more efficiently. Also, if the carbon dioxide contains about 0.1% of water, the silicon nitride film or the organic resin film could be removed more efficiently. When silicon dioxide films are used as the supporting films, subcritical water may naturally be used.

Alternatively, silicon nitride and dioxide films may be used as the supporting film and the film to be removed, respectively. In that case, the silicon dioxide films may be removed selectively using the supercritical or subcritical (roughly subcritical) water, adjusted to have a high pH in the vessel, as an etchant.

Embodiment 3

A charge emitting device, implemented by using the inventive etching method, will be described as a third embodiment of the present invention.

Figure 11:
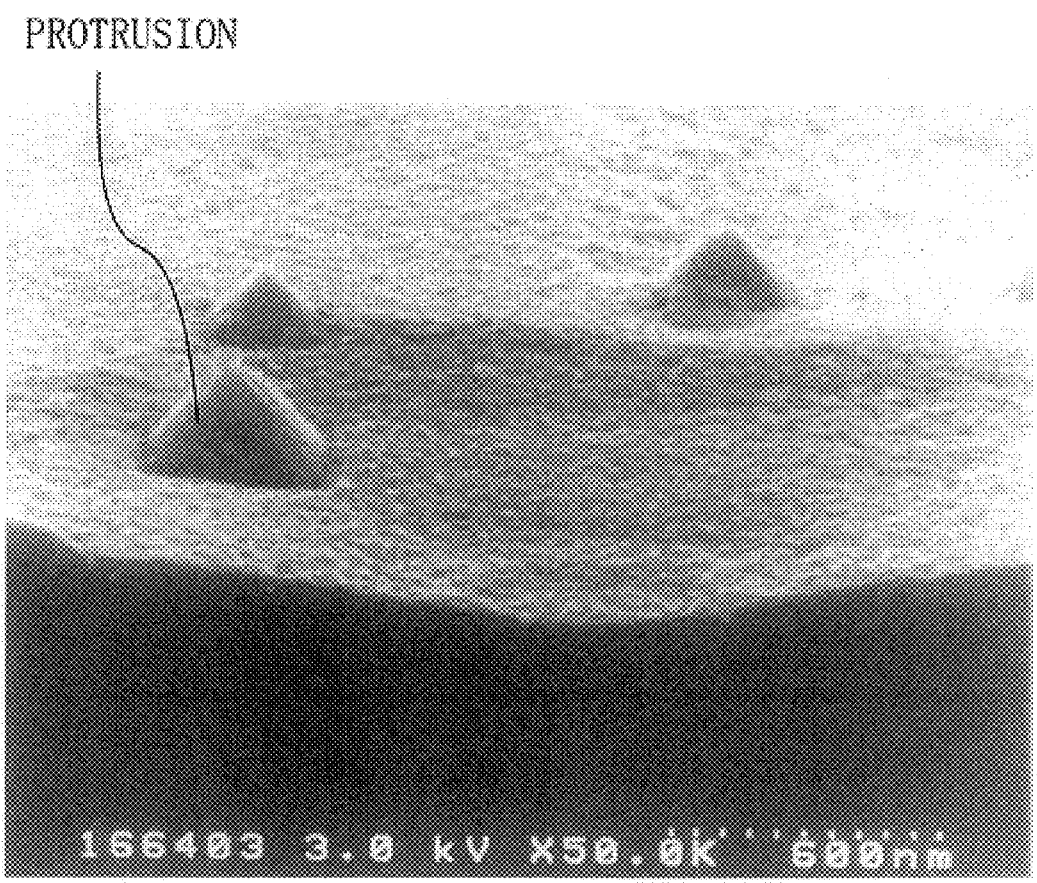
FIG. 11 is an SEM photograph showing the surface state of a silicon substrate with a principal surface, which is one of the {100} family of planes, when the substrate was exposed to a water as a subcritical liquid.

FIG. 11 is an SEM photograph showing the surface state of a silicon substrate with a principal surface, which is one of the {100} family of planes, when the substrate was exposed to a water at a pressure of 10 MPa and at a temperature of 200° C. for about 10 minutes. We found that the surface of the silicon substrate was etched at various rates changing with the crystallographic plane orientations to form pyramidical silicon protrusions on the surface of the substrate as shown in FIG. 11. Those semiconductor protrusions can be used for forming devices emitting charge from their tip. Thus, in accordance with the inventive etching technique using the water as a roughly subcritical liquid, a charge emitting device can be formed.

FIGS. 12A through 12E are cross-sectional views illustrating part of the process for fabricating a charge emitting device according to this embodiment. The process shown in FIGS. 12A through 12E is application of Gray and others' field discharge cathode and its fabricating method (see H. F. Gray et al., IEDM Tech. Dig. p.776, (1986)) to the present invention. Specifically, in the method described in this document, a silicon substrate is used and an anisotropic etching process is performed, thereby forming a conical field discharge cathode that can be easily formed in a controlled shape for an emitter.

Figure 12A:
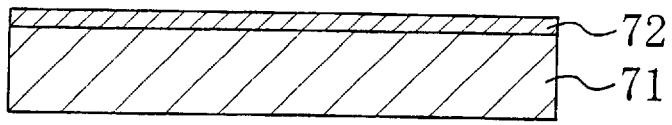
FIGS. 12A through 12E are cross-sectional views illustrating part of the process for fabricating a charge emitting device according to a third embodiment of the present invention.
Figure 12B:
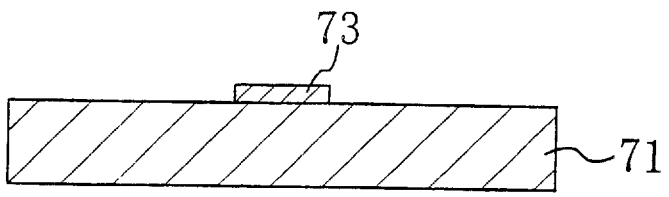

First, as shown in FIG. 12A, a silicon dioxide film 72 is deposited on the principal surface ((100) plane) of a silicon substrate 71. Then, as shown in FIG. 12B, the silicon dioxide film 72 is patterned by ordinary photolithography and etching processes, thereby defining a round mask 73.

The silicon substrate 71 is etched at various rates changing with the crystallographic plane orientations (the reason will be detailed later). By utilizing this phenomenon, an anisotropic etching process is performed on the substrate 71, thereby forming a conical silicon region 74 under the round mask 73 defined over the substrate 71 as shown in FIG. 12C.

Figure 12C:
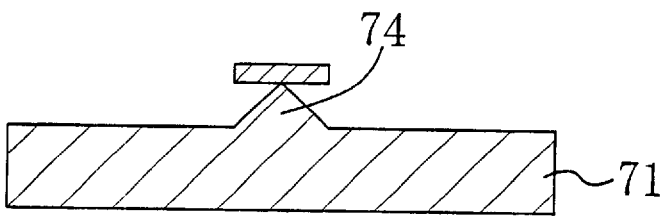
Figure 12D:
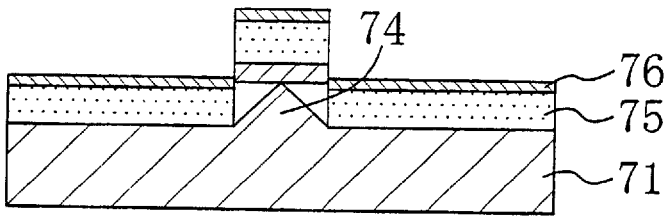

Thereafter, as shown in FIG. 12D, insulating layer 75 and metal film 76 for gate electrode are deposited over the substrate by an evaporation process. In this case, the round mask 73 functions as an evaporation mask. Accordingly, no part of the insulating layer 75 and metal film 76 is deposited on the side face of the conical silicon region 74. As a result, a gap is made between the conical silicon region 74 and the round mask 73.

Figure 12E:
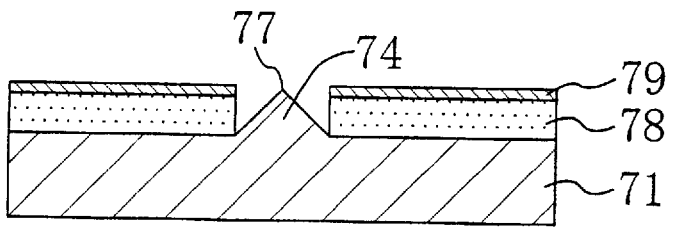

Next, as shown in FIG. 12E, parts of the insulating layer 75 and metal film 76 over the round mask 73 and the round mask 73 itself are removed, thereby forming an interlevel dielectric film 78 and extended electrodes 79. Succeeding process steps are not shown in the drawings. For example, by using the method disclosed in Japanese Patent Application 08-083694, a charge emitting device, in which the tip 77 of the conical silicon region 74 is used as a field discharge cathode, may be formed.

In a known fabricating process, the anisotropic etching process step shown in FIG. 12C is generally performed for a long period of time using an alkaline solution, e.g., a KOH. According to the inventive method, however, the conical silicon region 74 can be formed just by exposing the substrate to the water as a roughly subcritical liquid at a pressure of 10 MPa and at a temperature of 200° C. for about 10 minutes. A (111) plane is denser than a (100) plane. Thus, we found that the (111) plane was etched at a rate lower than the (100) plane in the process of etching the conductive substrate 71. Also, if the water prepared under the conditions of this embodiment is used as an etchant, the round mask 73 is hardly etched because the silicon dioxide film is etched at a negligibly low rate compared to the silicon substrate. As a result, the conical silicon region 74 shown in FIG. 12C can be easily formed. Eventually, it is possible to form a charge emitting device, in which the tip 77 of the conical silicon region 74 is used as a high-performance field discharge cathode. The field discharge cathode of the charge emitting device may be used as an important component for a display device, e.g., PDP.

Figure 13:
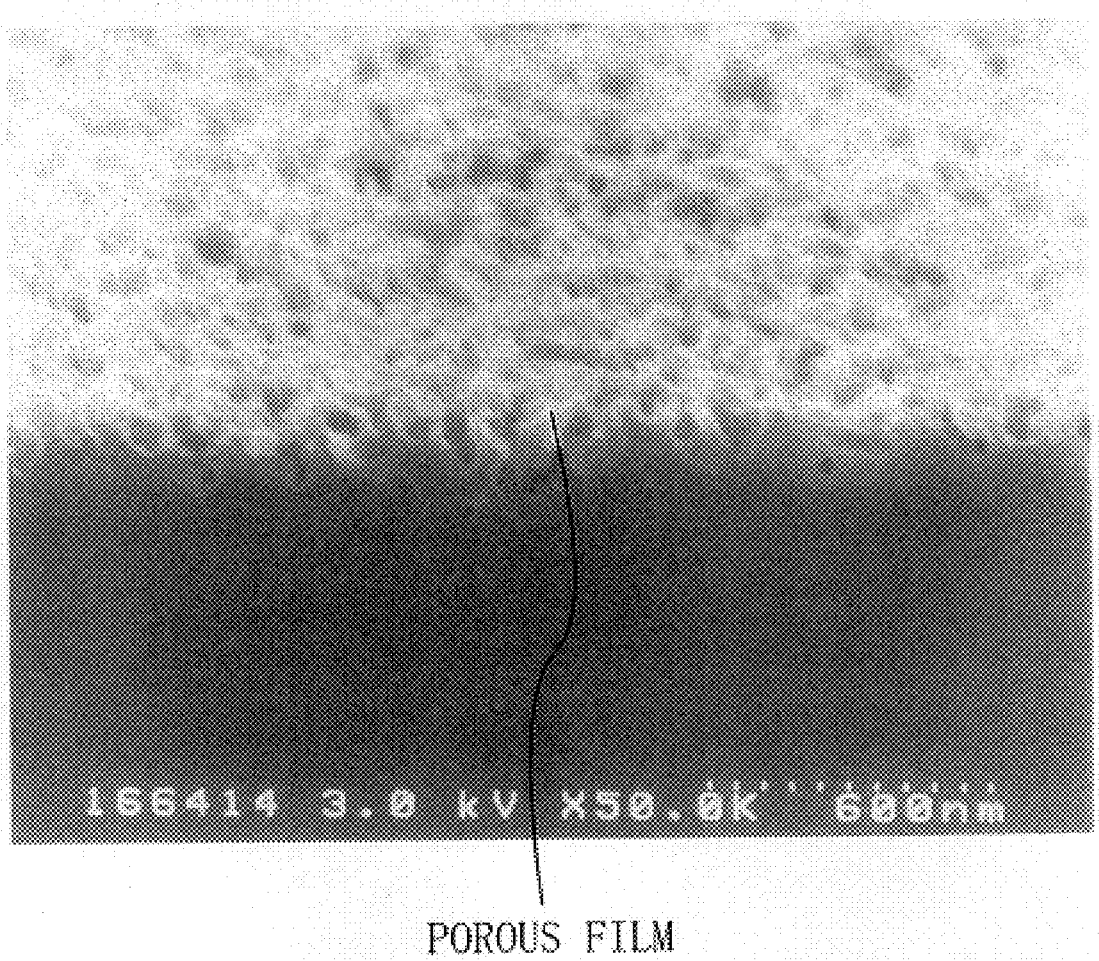
FIG. 13 is an SEM photograph showing the surface state of a silicon substrate with a principal surface, which is one of the {100} family of planes, when the substrate was exposed to a supercritical water.

FIG. 13 an SEM photograph showing the surface state of a silicon substrate with a principal surface, which is one of the {100} family of planes, when the substrate was exposed to a water at a pressure of 25 MPa and at a temperature of 400° C., i.e., what we call a supercritical water, for about 10 minutes. We found that the silicon substrate was not etched anisotropically under these conditions, thus forming a porous film on the surface of the substrate as shown in FIG. 13. It is known that if the portion between each pair of pores of that porous film is thin enough (i.e., on the order of several nm) to produce quantum effects, the porous film can function as a light emitter that emits light in a desired color, e.g., blue, by applying a bias between the porous film. Accordingly, by performing an etching process using the supercritical water, a light emitter (charge emitting device), emitting light at a wavelength in a desired range, can be formed.

Other Embodiments

The inventive selective etching method is not limited to the foregoing embodiments and is broadly applicable to any process in which only a silicon nitride film needs to be selectively etched away.

In the etching apparatus shown in FIG. 3, the water that has been used for the etching process does not have to be disposed of, but may be used again by circulating the water from the reservoir 37 to the tank 26 via a circulating pipe indicated by the dashed line in FIG. 3. In that case, the separator 34 may vaporize only the water or may receive a substance that precipitates an etch reactant and drain only the water with the precipitation removed.

What is claimed is:

1. An apparatus for etching a target layer of an object being processed using a fluid, the apparatus comprising:

a vessel in which the object being processed is loaded and subjected to an etching process, and which has a closed system and pressure therein that can be increased higher than the atmospheric pressure;

a fluid supplier for pressurizing the fluid and supplying the fluid into the vessel;

means for separating the fluid, drained from the vessel, from a substance resulting from the etching process;

a reservoir for storing the fluid that has been separated by the separating means;

means for circulating the fluid from the reservoir back to the fluid supplier; and a pressure controlling mechanism for controlling the pressure in the vessel.

2. The apparatus of claim 1, wherein the fluid is a water, and wherein the separating means vaporizes the water to separate the water from the substance resulting from the etching process.

3. The apparatus of claim 1, wherein the separating means condenses the substance resulting from the etching process to separate the substance from the fluid.

* * * * *